United States Patent [19]
Pham et al.

[11] Patent Number: 6,093,650
[45] Date of Patent: *Jul. 25, 2000

[54] METHOD FOR FULLY PLANARIZED CONDUCTIVE LINE FOR A STACK GATE

[75] Inventors: Tuan Duc Pham, Santa Clara; Michael Karpovich Templeton, Atherton, both of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/992,541

[22] Filed: Dec. 17, 1997

[51] Int. Cl.[7] .................. H01L 21/3205; H01L 21/4763; H01L 21/44; H01L 21/302

[52] U.S. Cl. .................. 438/692; 438/587; 438/593; 438/631; 438/633; 438/683

[58] Field of Search .................. 438/692, 691, 438/633, 645, 631, 683, 593, 587, 588, 257–266

[56] References Cited

U.S. PATENT DOCUMENTS

| | | | |
|---|---|---|---|
| 4,874,715 | 10/1989 | Paterson | 437/43 |
| 4,944,836 | 7/1990 | Beyer et al. | 156/645 |
| 4,997,781 | 3/1991 | Tigelaar | 438/257 |
| 5,084,071 | 1/1992 | Nenadic et al. | 51/309 |
| 5,236,853 | 8/1993 | Hsue | 438/262 |
| 5,266,446 | 11/1993 | Chang et al. | 430/314 |
| 5,635,415 | 6/1997 | Hong | 438/261 |
| 5,688,705 | 11/1997 | Bergemont | 438/588 |
| 5,753,525 | 5/1998 | Hsue et al. | 438/262 |
| 5,767,005 | 6/1998 | Doan et al. | 438/593 |

*Primary Examiner*—John F. Niebling
*Assistant Examiner*—Ha Tran Nguyen
*Attorney, Agent, or Firm*—Foley & Lardner

[57] ABSTRACT

A method for substantially reducing conductive line cracking on an integrated circuit, comprising the steps of: obtaining a semiconductor structure with a first surface and with an insulating region adjacent to and rising above the first surface; and forming a layer of a first conductive material above the first surface of the semiconductor structure and above the adjacent first insulating region. Additionally the method includes forming an opening through the layer of first conductive material down to the first insulating region; polishing the layer of first conductive material; and forming an insulation layer over the layer of first conductive material. The method further includes the steps of forming a layer of a second conductive material above the insulation layer; polishing the layer of second conductive material; and forming a third conductive layer above the layer of second conductive material.

8 Claims, 3 Drawing Sheets

METHOD FOR FULLY PLANARIZED CONDUCTIVE LINE FOR A STACK GATE

BACKGROUND OF THE INVENTION

The present invention relates generally to methods for forming integrated circuit chips, and more particularly, to a method for substantially eliminating conductive line cracking in an integrated circuit chip.

An integrated circuit chip comprises an array of devices formed in a semiconductor substrate, with the contacts for these devices interconnected by patterns of conductive wires. As the density of devices fabricated on a given chip increases, problems arise in providing reliable interconnections between the various devices. In order to take full advantage of the device and circuit density on a given chip, it is necessary to make interconnections among the various devices and circuit elements in the chip in a high density manner. A particular problem has arisen in the fabrication of high density conductive lines due to the prevalence of cracking and gaps forming in those lines. This problem is particularly evident in integrated circuit memory arrays where frequent cracks have been found in wordlines thereby directly affecting the reliability of the integrated circuit memory.

SUMMARY OF THE INVENTION

Briefly, the present invention comprises a method for substantially reducing layer cracking on an integrated circuit, comprising the steps of obtaining a semiconductor structure with a substantially horizontal first surface and an adjacent region that rises above the first surface; forming a first layer of material over the first surface and the adjacent region, with the first layer having an upper surface; forming an opening through the first layer down to the adjacent region; and polishing the first layer to substantially flatten the upper surface of the first layer. The method further comprises the steps of forming a second layer of material above the first layer of material, with the second layer having an upper surface; and polishing the second layer of material to substantially flatten its upper surface.

In a preferred embodiment of the present invention, at least one of the polishing steps comprises chemical-mechanical polishing.

In yet a further preferred embodiment of the present invention, the method comprises the step of forming a metallic silicide layer above the polished second layer.

In yet a further embodiment of the present method, the opening forming step comprises the step of forming an opening to have substantially vertical sidewalls.

In yet a further aspect of the invention, a method is disclosed for substantially reducing conductive line cracking on an integrated circuit, comprising the steps of: obtaining a semiconductor structure with a first surface and with a first insulating region adjacent to and rising above the first surface; forming a layer of a first conductive material above the first surface of the semiconductor structure and above the adjacent first insulating region; forming an opening through the layer of first conductive material down to the first insulating region; and polishing the layer of first conductive material. This method further includes the steps of forming an insulation layer over the layer of first conductive material; forming a layer of second conductive material above the layer of insulation; polishing the layer of second conductive material; and forming a third conductive layer above the layer of second conductive material.

In a preferred embodiment of this inventive method, at least one of the polishing steps comprises chemical-mechanical polishing.

In yet a further preferred aspect of the present inventive method, the opening forming step comprises the step of forming the opening to have substantially vertical sidewalls.

In yet a further aspect of the preferred method of present invention, at least one of the first and second conductive materials is doped polysilicon. Additionally, the third conductive material may comprise tungsten silicide.

DETAILED DESCRIPTION OF THE PREFERRED EMBODIMENTS

Figure 1A:
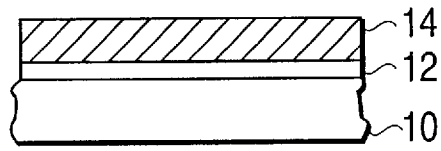
FIG. 1A is a cross-section of a semiconductor structure.

Referring now to the drawings, these drawings are provided to illustrate one exemplary implementation of the present invention, and are not intended to be limiting in their scope. Additionally, it should be noted that these drawings are illustrative in nature and thus, are not drawn to scale.

Referring now to FIG. 1A, there is illustrated a semiconductor structure which, in an exemplary embodiment, comprises a silicon substrate 10. By way of example, this silicon substrate 10 may be single crystal P-type silicon with an orientation which is most likely [100]. A thin layer of insulator is formed over the silicon substrate 10. This insulator layer 12 may conveniently comprise a thermally grown $SiO_2$ and is typically referred to as a barrier oxide layer. Formed over the insulator layer 12 is a second different insulator layer 14 to function as an oxidation hard mask. By way of example, this second different insulator layer 14 may comprise a silicon nitride ($Si_xN_y$, hereinafter referred to as a nitride) layer formed by means of a CVD process.

Figure 1B:
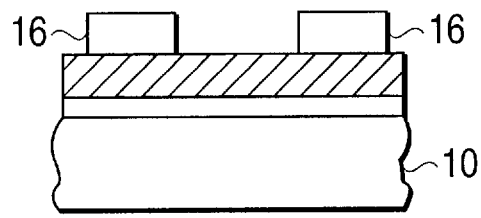
FIG. 1B is a cross-section of the structure of FIG. 1A with a photo-resist pattern thereon.

Referring now to FIG. 1B, the semiconductor structure of FIG. 1A is shown with a patterned photo-resist layer 16 formed thereon. The resist pattern is used to protect the areas where active regions of devices will be formed. This patterning may be accomplished by means of standard lithography and etching techniques which are well-known in the art.

Figure 1C:
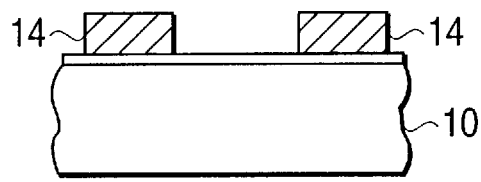
FIG. 1C is a cross-section of a semiconductor structure of FIG. 1B after etching.

Referring now to FIG. 1C, the semiconductor structure shown in FIG. 1B is shown after an etching step and a photo-resist clean step. The etching step operates to remove all of the nitride layer 14 that is exposed, i.e., that which is not covered or protected by the photo-resist pattern 16 and some portions of the oxide layer 12.

Figure 1D:
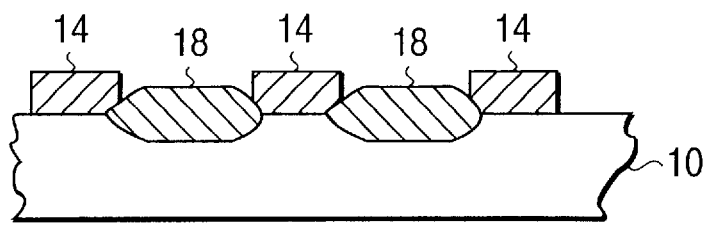
FIG. 1D is the cross-section of FIG. 1C after a field oxide growth.

Referring now to FIG. 1D, a field oxide region 18 is grown, by way of example, by a thermal growth process using wet or dry oxidation, in the exposed areas not covered by the nitride pattern 14. A typical field oxide region may rise above the surface of the surrounding semiconductor area by about 1000 to 4000 angstroms.

Figure 2A:
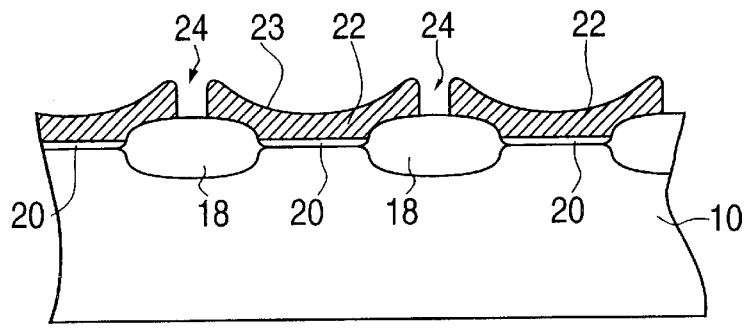
FIG. 2A is the cross-section of FIG. 1D after an oxide step, a polysilicon deposition step, and an anisotropic etching step.

Referring now to FIG. 2A, the nitride pattern 14 is removed by means of a nitride clean step and a thin oxide layer 20 is formed over the semiconductor substrate. This thin oxide layer 20 may be formed utilizing standard thermal growth techniques in an oxidation ambient. In thermal grow processes, the silicon oxide layer 20 will be formed on the exposed silicon substrate, but typically no additional oxide will form on the field oxide regions 18. Note that some deposition processes are available that may form extra oxide on the regions 18. In a preferred embodiment, this oxide layer 20 may be on the order of 100 angstroms. Following the formation of this oxide layer 20, a conductive polysilicon layer 22 is deposited thereover, by way of example, by a CVD process. The polysilicon layer may be amorphous polysilicon and may include doping, or doping may be added after deposition to provide a desired conductivity. This polysilicon layer 22 typically will be deposited to a thickness on the order of 500–1100 angstroms.

The polysilicon layer deposition step is then followed by a photolithographic patterning step using photoresist and an etching step to form openings 24 through the polysilicon layer 22 down to the field oxide layer 18. In a preferred embodiment, these openings are formed by directionally etching the top surface of the doped polysilicon layer after masking using standard photo-lithographic techniques. Such photo-lithographic masking techniques are well-known in the art. The directional etch in plasma form is utilized to form trenches with vertical sidewalls in areas of polysilicon not covered by the patterned photoresist mask. The result of this directional etching process are openings having sidewalls which are substantially vertical. The photoresist pattern is then removed.

Figure 2B:
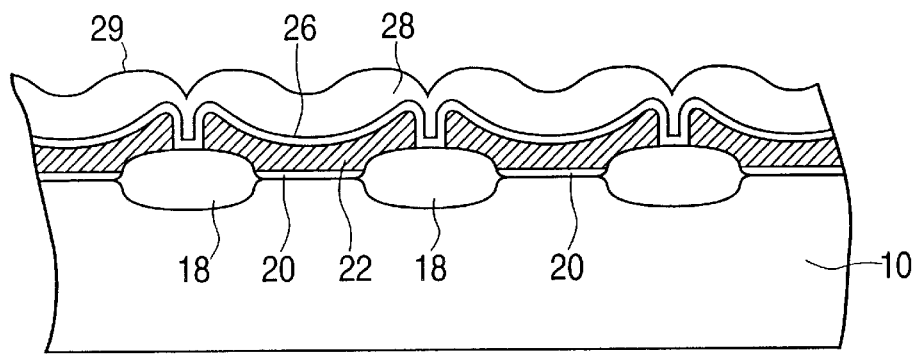
FIG. 2B is the cross-section shown in FIG. 2A after an insulator formation step and a deposition of a second layer of polysilicon have been performed, and illustrating the recesses or gaps above each field oxide region.

Referring now to FIG. 2B, the semiconductor structure of FIG. 2A is shown after an ONO formation process and the deposition of a second layer of polysilicon. Specifically, the ONO layer 26 may be formed, by way of example, by forming a first layer of oxide by means of a thermal grow process or an HTO process, forming a second layer of nitride by means of chemical vapor deposition, and forming a third layer of oxide by means of a wet oxidation process or an HTO process. By way of example, but not by way of limitation, this ONO layer 26 may be on the order of 160 angstroms.

Following the deposition of ONO insulating layer 26, a second layer of polysilicon 28 is deposited in a well-known manner, such as by a CVD process. This second layer of polysilicon 28 may have a thickness on the order of 1200 angstroms or less. For this embodiment, the preferred second polysilicon layer 28 should have a higher doping level than the first polysilicon layer 22. This doping to obtain the desired conductivity may be accomplished during the layer deposition phase or after the deposition of the polysilicon layer.

It can be seen from a review of FIG. 2B that there is a significant depression or gap, or indent on the surface 29 of the second polysilicon layer 28 above the field oxide regions 18. This gap is due to the physical requirement that the second polysilicon material fill the openings 24 above each of the field oxide regions 18. These indents or recesses cause cracking in material layers deposited over the top of this layer 28.

Figure 2C:
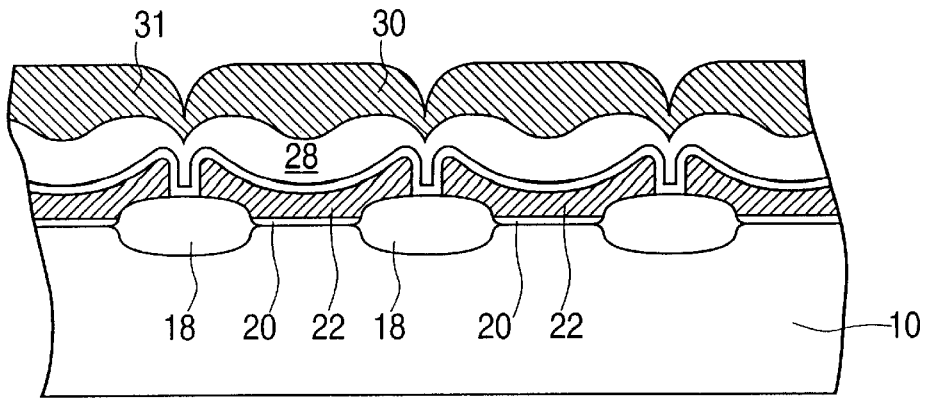
FIG. 2C is the cross-section shown in FIG. 2B after the deposition of a metal silicide, and illustrates the recess or gap in this metal silicide layer above each of the field oxide regions.

Referring to FIG. 2C, the semiconductor structure of FIG. 2B is shown after a deposition of a metal layer 30 thereon. By way of example, this layer 30 may comprise a conductive metal or metal silicide such as tungsten silicide. It can be seen from a review of FIG. 2C that the same type of indents or recesses form in the top surface 31 of the conductive layer 30 directly above the indents or recesses in the layer 28. Accordingly, significant cracking and other reliability problems occur in the layer 30. This is especially important in this embodiment because layer 30 is carrying most of the current.

Figure 3A:
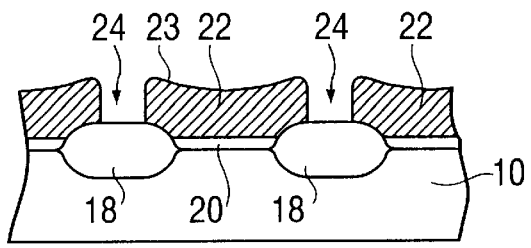
FIG. 3A shows the cross-section of FIG. 1D after an insulator formation step, the deposition of a polysilicon layer, an anisotropic etch step, and a polishing step.

FIG. 3A–3D show the process steps in accordance with the present invention. Referring now to FIG. 3A, the basic structure of FIG. 2A is shown. Specifically, the semiconductor substrate 10 has field oxide regions 18 formed therein with an insulator layer 20 of oxide formed thereover. A first polysilicon layer 22 is deposited on the surface of the insulator 20 and the field oxide regions 18. An opening 24 is formed in the first polysilicon layer 22 down to the first field oxide region 18. As noted previously, it is preferred that the sidewalls for these openings 24 be substantially vertical. Accordingly, these openings are obtained by means of an anisotropic etching process as discussed previously.

However, it can be seen that the top surface 26 of the first polysilicon layer 22 is substantially flatter than the top surface 23 of the first polysilicon layer 22 in FIG. 2A. This substantial flattening of the top surface 25 is accomplished by means of a polishing step. In a preferred embodiment of the present invention, this polishing step is accomplished by means of chemical-mechanical polishing. Chemical-mechanical (CMP) polishing processes employ both a chemical and a mechanical component. A rotating or vibrating disk or pad is moved relative to the semiconductor wafer surface in the presence of a chemical-mechanical polishing slurry. This CMP slurry generally includes suspended solids as well as a chemical solution component which attacks the material being polished. The two processes in combination etch the upper layer of a wafer by chemical and mechanical action which removes high points much faster than the low points on the wafer surface. Typical chemical-mechanical polishing method and slurry are disclosed in U.S. Pat. No. 4,944,836 and U.S. Pat. No. 5,084,071. The chemical-mechanical polishing slurry may typically include silica particles or other particles such as alumina with a particle size of about 100–250 nm, for example. The chemicals utilized in order to etch the polysilicon layer 22 are standard chemicals used in the art. Note that CMP also encompasses slurries that contain mechanical grit but no chemical etchant. The result of this chemical-mechanical polishing process is a substantially flattened upper surface 23 on the first polysilicon layer 22.

Figure 3B:
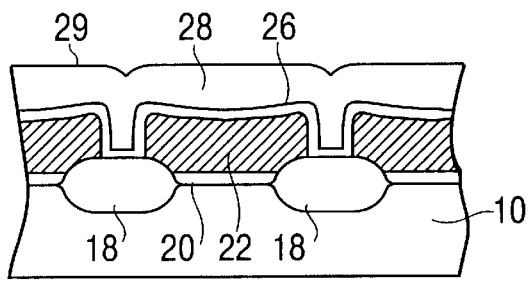
FIG. 3B is the cross-section of FIG. 3A after the formation of an insulator layer and the deposition of a second polysilicon layer.

Referring now to FIG. 3B, an ONO layer 26 is formed followed by the deposition of a second layer of polysilicon 28 in the same manner as in FIG. 2B. This second polysilicon layer may be amorphous polysilicon which is doped or it may be doped at a later stage in the process. The doping of this polysilicon layer should be such as to achieve a conductivity which is greater than the first polysilicon layer 22. It can be seen that despite the substantial flattening of the top surfaces of the first polysilicon layer 22, that the top surface 29 of the second polysilicon layer 28 still has an indent or a recess above each of the field oxide regions 18 where the openings 24 were located. Although these indents or recesses in the surface 29 are smaller in size than the indents or recesses shown in FIG. 2B of the prior art, they are present there nonetheless.

Figure 3C:
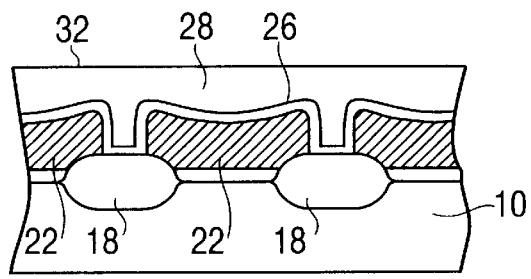
FIG. 3C is the cross-section shown in FIG. 3B after a polishing step.

Referring now to FIG. 3C, a second chemical-mechanical process is performed on the second polysilicon layer 28 to form a substantially flattened surface 32.

Figure 3D:
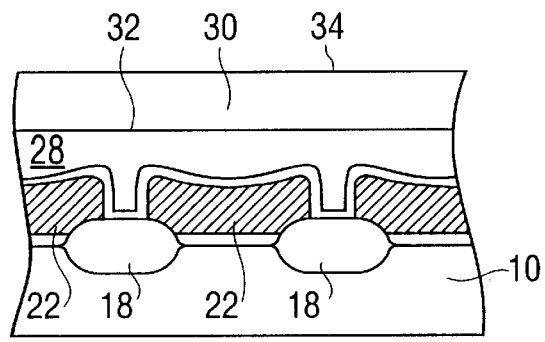
FIG. 3D is the cross-section of semiconductor structure shown in FIG. 3C after the deposition of a metal or metal silicide layer.

Referring now to FIG. 3D, a conductive layer 30 has been deposited on the polished top surface 32 of the second polysilicon layer 28. This conductive layer 30 may be a metal or a metal silicide layer such as tungsten silicide as noted previously for FIG. 3C. It can be seen that because indents or recesses have been substantially eliminated from the top surface 32 of the polysilicon layer 28, the top surface 34 for the conductive layer 30 is substantially planar with no indents or recesses. Accordingly, one of the primary causes of conductive line cracking is eliminated by means of this process.

It can be seen that the foregoing process is particularly advantageous for improving the reliability of integrated circuit structures that utilize conductive lines. The process may be utilized anytime a conductive line is connected to a transistor. For example, the process may be advantageously utilized for arrays of wordlines in memory chips or for conductive lines to NOR and NAND gates.

Additionally, the present invention is advantageous for creating planar surfaces in any situation where one or more openings or windows are formed in a layer and followed by the deposition of a layer or sequence of layers. The present inventive method is advantageous in obtaining substantially planar top surfaces which are not subject to cracking and reliability problems.

It should be noted that the foregoing description of the preferred embodiment is exemplary in nature. It is contemplated that one or more additional process steps may be included between the individual process steps recited in the description and the claims. Additionally, the use of the word "above" in setting forth a sequence of layers, for example, a second layer above a first layer, is not intended to preclude additional intervening layers between the first and second layers. Thus, the recitation in the claims that a first conductive material is formed above the surface of a semiconductor structure and a first insulating region clearly contemplates that one or more additional layers, such as an insulating layer for example, could be applied to the semiconductor structure prior to the application of the first conductive material. Additionally, various well-known process and clean steps have not been recited in the present description in order to properly focus the disclosure on the invention.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment herein was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for substantially reducing conductive line cracking on an integrated circuit, comprising the steps of:
    obtaining a semiconductor structure with a first surface and with a first insulating region adjacent to and rising above said first surface;
    forming a layer of a first conductive material above said first surface of said semiconductor structure and above said adjacent first insulating region;
    forming an opening through said layer of first conductive material down to a top surface of said first insulating region;
    polishing said layer of first conductive material to achieve a single substantially level surface across substantially the whole of said layer of first conductive material;
    forming an insulation layer over said layer of first conductive material;
    forming a layer of a second conductive material above said insulation layer;
    polishing said layer of second conductive material; and
    forming a third conductive layer above said layer of second conductive material.

2. A method as defined in claim 1, wherein at least one of said polishing steps comprise chemical-mechanical polishing.

3. A method as defined in claim 2, wherein said opening forming step comprise the step of forming said opening to have substantially vertical sidewalls.

4. A method as defined in claim 3, wherein at least one of said first and second conductive materials is doped polysilicon.

5. A method as defined in claim 3, wherein said third conductive layer is tungsten silicide.

6. A method as defined in claim 3, wherein both of said polishing steps comprise chemical-mechanical polishing.

7. A method as defined in claim 1, wherein said layers of second conductive material and said third conductive material form a wordline.

8. A method for substantially reducing conductive line cracking in a core array wordline in an integrated circuit memory, comprising the steps of:
    obtaining a semiconductor structure with a plurality of field oxide regions that rise above adjacent surfaces of said semiconductor structure;
    forming an oxide layer above said adjacent surfaces of said semiconductor structure;
    forming a first polysilicon layer above said oxide layers;
    reactive ion etching on opening with vertical sidewalls through said first polysilicon layer over each one of a plurality of said field oxide regions down to an upper surface of said field oxide regions;
    chemical-mechanical polishing said first polysilicon layer to achieve a single substantially level surface across the whole of said first polysilicon layer;
    forming an insulation layer over said polished first polysilicon layer;
    forming a second polysilicon layer above said insulation layer;
    chemical-mechanical polishing said second polysilicon layer; and
    forming a metal-silicide conductive layer above said polished second polysilicon layer to thereby form a wordline.

* * * * *